United States Patent
Werner et al.

(10) Patent No.: US 8,084,766 B2
(45) Date of Patent: Dec. 27, 2011

(54) ORGANIC OPTOELECTRONIC COMPONENT

(75) Inventors: Ansgar Werner, Dresden (DE); Gregor Schwartz, Dresden (DE); Kentaro Harada, Dresden (DE); Karsten Walzer, Dresden (DE); Martin Pfeiffer, Dresden (DE); Karl Leo, Dresden (DE)

(73) Assignee: Novaled AG, Dresden (DE)

( * ) Notice: Subject to any disclaimer, the term of this patent is extended or adjusted under 35 U.S.C. 154(b) by 486 days.

(21) Appl. No.: 12/160,344

(22) PCT Filed: Jan. 11, 2007

(86) PCT No.: PCT/EP2007/000208
§ 371 (c)(1),
(2), (4) Date: Jan. 14, 2009

(87) PCT Pub. No.: WO2007/082673
PCT Pub. Date: Jul. 26, 2007

(65) Prior Publication Data
US 2010/0289007 A1 Nov. 18, 2010

(30) Foreign Application Priority Data
Jan. 11, 2006 (EP) .................... 06000436

(51) Int. Cl.
*H01L 51/50* (2006.01)
(52) U.S. Cl. .................... 257/40; 257/79; 313/506
(58) Field of Classification Search .................... 257/40, 257/79; 313/506; 423/447.1, 447.2
See application file for complete search history.

(56) References Cited

U.S. PATENT DOCUMENTS

| | | | |
|---|---|---|---|
| 5,150,006 | A | 9/1992 | Van Slyke et al. |
| 6,356,032 | B1 | 3/2002 | Suzuki et al. |
| 6,476,550 | B1 | 11/2002 | Oda |
| 6,630,684 | B2 | 10/2003 | Lee |
| 6,717,358 | B1 | 4/2004 | Liao et al. |
| 6,878,297 | B1 | 4/2005 | Berger et al. |
| 6,885,025 | B2 | 4/2005 | Tung et al. |
| 6,965,197 | B2 | 11/2005 | Tyan |

(Continued)

FOREIGN PATENT DOCUMENTS

DE 19625622 1/1998

(Continued)

OTHER PUBLICATIONS

Hong et al, "Effective hole injection of organic light-emitting diodes by introducing buckminster fullerene on the indium tin oxide anode" Applied Physics Letters, AIP, American Institute of Physics, Melville, NY, US, vol. 87, No. 6, Aug. 1, 2005, p. 63502, XP012077425 ISSN: 0003-6951.*

Carter, S. A. et al., "Enhanced luminance in polymer composite light emitting devices," Appl. Phys. Lett., vol. 71, pp. 1145-1147, Sep. 1997.

(Continued)

*Primary Examiner* — Thomas L Dickey
(74) *Attorney, Agent, or Firm* — Sutherland Asbill & Brennan, LLP

(57) ABSTRACT

The invention relates to an organic optoelectronic component comprising a base electrode, a top electrode that is provided with passages and an arrangement of organic layers, which is formed between the base electrode and the top electrode and makes electrical contact with said electrodes. In said component, light can be generated in a light-emitting region by the application of electrical energy to the base electrode and the top electrode. An organic current distribution layer also extends into the region containing the passages, said layer making electrical contact with the top electrode and the light-emitting region.

37 Claims, 4 Drawing Sheets

U.S. PATENT DOCUMENTS

Figure 1:
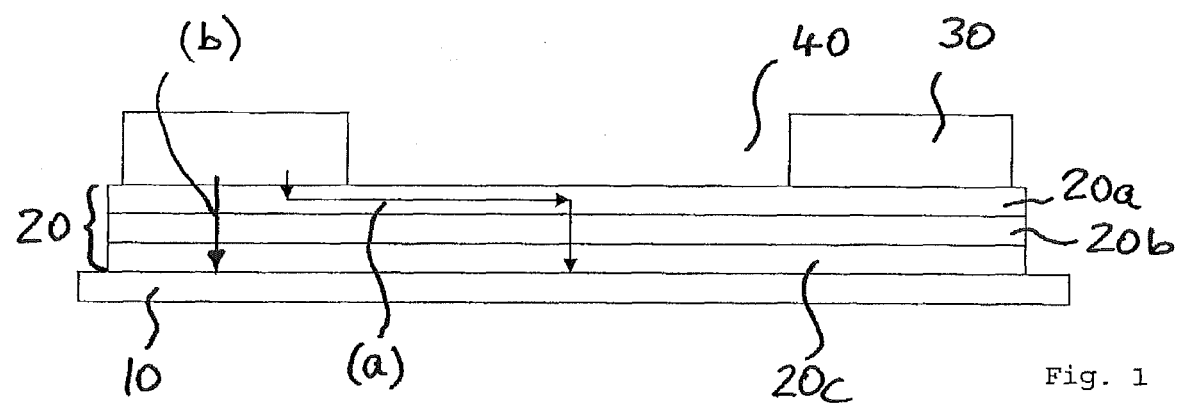

| | | | |
|---|---|---|---|
| 7,012,363 | B2 | 3/2006 | Weaver |
| 7,256,541 | B2 | 8/2007 | Birnstock |
| 2001/0026124 | A1 | 10/2001 | Liu et al. |
| 2001/0033135 | A1 | 10/2001 | Duggal et al. |
| 2001/0035713 | A1 | 11/2001 | Kimuea |
| 2001/0038102 | A1 | 11/2001 | Kawase |
| 2001/0055841 | A1 | 12/2001 | Yamazaki et al. |
| 2002/0015807 | A1 | 2/2002 | Sugino et al. |
| 2002/0084993 | A1 | 7/2002 | Teneya |
| 2002/0180372 | A1* | 12/2002 | Yamazaki ............. 315/169.3 |
| 2003/0062636 | A1 | 4/2003 | Chen |
| 2003/0111666 | A1 | 6/2003 | Nishi et al. |
| 2003/0111955 | A1 | 6/2003 | McNulty et al. |
| 2003/0127973 | A1 | 7/2003 | Weaver et al. |
| 2003/0146443 | A1 | 8/2003 | Yamazaki et al. |
| 2003/0164679 | A1 | 9/2003 | Hamano et al. |
| 2004/0012980 | A1 | 1/2004 | Sugiura et al. |
| 2004/0021434 | A1 | 2/2004 | Yoneda et al. |
| 2004/0066824 | A1 | 4/2004 | Magno |
| 2004/0109328 | A1 | 6/2004 | Dahl et al. |
| 2004/0135502 | A1 | 7/2004 | Kobayashi et al. |
| 2004/0183963 | A1 | 9/2004 | Nakamura |
| 2004/0227446 | A1 | 11/2004 | Fujimoto et al. |
| 2005/0118745 | A1* | 6/2005 | Yamazaki ................. 438/82 |
| 2005/0142379 | A1 | 6/2005 | Juni et al. |
| 2006/0033115 | A1 | 2/2006 | Blochwitz et al. |
| 2006/0152150 | A1 | 7/2006 | Boerner et al. |
| 2006/0175960 | A1 | 8/2006 | Noh et al. |
| 2007/0035236 | A1 | 2/2007 | Murano et al. |
| 2008/0048557 | A1 | 2/2008 | Birnstock et al. |

FOREIGN PATENT DOCUMENTS

| | | |
|---|---|---|
| DE | 3804293 | 8/1998 |
| DE | 19836943 | 4/2000 |
| GB | 2361356 | 10/2001 |
| GB | 2390215 | 12/2003 |
| WO | 02/37580 | 5/2002 |
| WO | 2004/086462 | 10/2004 |

OTHER PUBLICATIONS

Madigan, C.F. "Improvement of Output coupling efficiency of organic light emitting diodes by backside substrate modification," Appl. Phys. Lett., vol. 76, pp. 1650-1652, Mar. 2000.

Pfeiffer, M, et al., "Doped Organic semiconductors: physics and application in light emitting diodes," Organic Electronics, Elsevier, Amsterdam, NL, vol. 4, No. 2/3, Sep. 2003, pp. 89-103, XP001177135, ISSN: 1556-1199.

Schnitzer, J., "30% External Quantum Efficiency from Surface Textured, Thin-film Light emitting diodes," Applied Phys. Lett., vol. 63, pp. 2174-2176, Oct. 1993.

Yamasaki, T. et al., "Organic Light emitting device with an ordered monolayer of silica microspheres as a scattering medium," Appl. Phys. Lett., vol. 76, pp. 1243-1245, Mar. 2000.

Notice of Allowance, U.S. Appl. No. 11/463,697 (May 13, 2009).

Non-Final Office Action, U.S. Appl. No. 11/463,697 (Dec. 15, 2008).

Search Report for EP 1753048; Feb. 8, 2006 (EP 05 017 542).

Search Report for PCT/DE2005/001229; Jul. 31, 2006.

Non-final Rejection, U.S. Appl. No. 11/572,458, (Apr. 24, 2009).

Lupton, J. M. et al., "Bragg scattering from periodically microstructured light emitting diodes," Appl. Phys. Lett., vol. 77, pp. 3340-3342, Nov. 2000.

Disclosure Under 37 CFR 1.56 for U.S. Appl. No. 12/160,344 (Submitted Herewith).

Final Office Action; U.S. Appl. No. 11/572,458; (Dec. 16, 2009).

Response to Office Action; U.S. Appl. No. 11/572,458; Aug. 24, 2009.

Response to Office Action; U.S. Appl. No. 11/463,697; Apr. 15, 2009.

Froeb, H. et al., "Extremely high quantum efficiencies from organic dyes in inorganic matrix layers," Proceedings of the 1998 Conference on Lasers and Electro-optics, CLEO; San Francisco, CA, USA, May 3-8, 1998, pp. 210-211.

Resch-Genger et al., "Quantum dots versus organic dyes as fluorescent labels," 2008, Nature Methods, vol. 5, No. 9, pp. 763-776.

Non-Final Rejection; U.S. Appl. No. 11/574,419; Sep. 11, 2009.

* cited by examiner

ORGANIC OPTOELECTRONIC COMPONENT

The invention relates to an organic optoelectronic component, in particular an organic light-emitting diode.

BACKGROUND OF THE INVENTION

Electroluminescent organic material has become an intensely adapted research field since its first observation in 1953 (Bernanose et al., J. Chem. Phys. 1953, 50, 65). The known advantages of organic materials for generating light—such as minimal re-absorption, high quantum efficiency (QE), or the possibility to adapt the emissions spectrum through relatively simple variation of the molecule structure, for example—were able to be exploited in recent years, through constant development in material research and the implementation of new concepts, for effective injection and transportation of charge-carriers into the active emissions layer of an organic light element. The first display devices, which were based on such so-named organic LEDs, have already found their way onto the market, and organic LEDs will, in the future, as a concept be firmly established next to liquid crystal displays (LCDs) and displays of inorganic LEDs. Another market which stands open to the organic LEDs, due to their special ability to emit light in a widespread and homogeneous way into half space, is the area of illumination.

Light is often emitted through a transparent substrate (the so-called bottom-emission structure) in organic LEDs. In some cases, it can be advantageous to use a non-transparent substrate for improving the performance parameters of the component or for reducing the production costs. In this case, the light is emitted through the top electrode of the layer structure. For this purpose, a sufficiently transparent top electrode is needed. Both approaches can also be combined in order to obtain transparent organic LEDs.

Transparent top electrodes are traditionally made of transparent conductive metal oxides, particularly Indium-Tin-Oxide (ITO). This approach has several difficulties, which compromise the operational capability of this solution. The conductivity of the ITO layer is low, so that in widespread structures, a voltage drop in the layer and therewith a lateral inhomogeneous light emission results from the sheet resistance. Furthermore, by means of a sputtering process, the layer or film is deposited. The underlying organic layers are usually very susceptible to the reactive ions which arise by this process. Adverse effects for the performance parameters of the component and the operational life span can only be party compensated by means of inserts of buffering layers. Usually, the metal oxides are well-suited for the injection of holes, namely for application as anodes, while the injection of electrons causes problems. Finally, the high proportion of indium in the ITO film means a significant cost factor.

Alternatively, these metal films or layers can be used as transparent top electrodes. Thin metal layers like 15 nm silver, for example, exhibit only minimal absorption and are sufficiently transparent. Adverse is the difficulty to controlledly deposit such thin layers. Furthermore these layers are not mechanically stable and often lead to a premature failure of the component due to a tear or crack in the top electrode. Eventually, the high reflectivity of the top electrode leads to difficulties controlling the interference effects within the component. The high Q-factor of the resulting microcavity results in the preferment of a narrower wavelength range of the resulting light, while other ranges are being suppressed. Particularly when white light is emitted, this results in a distortion of the intended emissions spectrum. So this component cannot be utilized for some application fields—for example, as illuminating element or as background illuminating element of an LCD display.

Eventually, it was proposed in the document US 2004/0021434 A1 that a top electrode with passages be provided. It became apparent that such passages adversely affect the shining impression of the component, since non-shining sections appeared in their range.

SUMMARY OF THE INVENTION

The task of the invention is to create an organic optoelectronic component with a top electrode with passages, whereby passages within the top electrode do not disturbingly affect the light impression of the component.

This task is solved, according to the invention, by an organic optoelectronic component comprising a base electrode, a top electrode that is provided with passages, and an arrangement of organic layers, which arrangement is formed between the base electrode and the top electrode and makes electrical contact with said electrodes. In said component, light can be generated in a light-emitting region by the application of electrical energy to the base electrode and the top electrode. An organic current distribution layer also extends into the region containing the passages, said layer making electrical contact with the top electrode and the light-emitting region.

With help of the organic current distribution layer, at the top electrode, injected electric charge-carriers in the form of holes or electrons also reach the sections of the light-emitting region in the arrangement of organic layers, which layers are situated underneath the passages of the top electrode, which passages can also be called recesses. In this manner, light is generated within the sections of the light-emitting region by means of re-combination of charge-carriers, so that these sections also contribute to light generation. In prior art, this light-generating re-combination takes place predominantly within the overlap region of the electrodes and not within the region including passages. The forming of the organic current distribution layer also into the region containing the passages means that the organic current distribution layer extends, overlapping with the passages, whereby the organic current distribution layer can extend within the passages themselves as well as over and underneath the passages or in any arbitrary combination of these subareas. Preferable is the overlapping between the organic current distribution layer and the passages also referred to as "openings" from a view of the component completely from the top.

The passages in the top electrode can be accomplished so that the top electrode is comprised of several bars or bridges, which, in turn, partly or completely encompass round or angular passages. A top electrode with several electrode elements formed like bars or bands can also be designed. In a functional embodiment, the top electrode is formed as a non-transparent electrode for the light generated within the light-emitting region. This makes possible the application of thick metal layers for the top electrode with a layer-thickness of 100 nm or more, whereby the stability of the component is optimized. The top electrode can be formed as an anode or cathode, according to the different construction forms for organic optoelectronic components.

Preferably, the organic current distribution layer is comprised of a thermally sublimable organic material, which material can be deposited by means of vacuum evaporation. In this manner, the technology of deposition, often used in the formation of organic layers, is usable, by means of vacuum evaporation, for forming the organic current distribution layer at the time of component manufacture.

A preferred improvement of the invention provides that the organic current distribution layer is formed such that it is in physical contact with the top electrode. In this embodiment, the organic current distribution layer is in direct contact with the top electrode. Alternatively, it can be designed so that the organic current distribution layer is in electrical contact with the top electrode over an electrically conductive section of material. A physical contact between the organic current distribution layer and the top electrode arises at the time of the manufacture of the optoelectronic component—for example, in that the material for the organic current distribution layer and the material for the top electrode are deposited directly onto one another, with either one being deposited first.

In a functional embodiment of the invention, it can be provided that the organic current distribution layer is formed so that it has an electric conductivity of at least 0.001 S/cm, preferably with an electric conductivity of at least 0.05 S/cm, and even more preferably with an electric conductivity of at least 1 S/cm. As an alternate quantity to be measured, the electrical resistance of the organic current distribution layer can be considered. It is advisably smaller than $10^8$ Ohm/square, preferably smaller than $10^6$ Ohm/square, and even more preferably smaller than $10^5$ Ohm/square. With the help of the provided electric conductivity, an optimized functionality of the organic current distribution layer is ensured, so that electric current can disperse in the form of a transport of electric charge-carriers within the organic current distribution layer, optimally in the lateral direction, that is, in the direction of the extension of the organic current distribution layer. When the component with its layer structure is viewed cross-sectionally, the obtained electric current distribution can also be considered as cross-conduction of electric charge-carriers.

Preferably, for the forming of the organic current distribution layer, a material will be used with which a high mobility for at least one type of electric charge-carriers is made available. The mobility is advantageously greater than $10^{-4}$ $cm^2$/V·s, preferably greater than $10^{-2}$ $cm^2$/V·s, and even more preferably greater than $10^{-1}$ $cm^2$/V·s.

An advantageous embodiment of the invention provides that a minimal size of the passage is at least as large as the total height of the arrangement of organic layers.

Preferably, an improvement of the invention provides that the organic current distribution layer is formed as an electric charge-carrier transporting layer wherein said charge-carrier is in the form of holes in the direction of the extension of the layer, when the top electrode is an anode.

In an advantageous embodiment of the invention, it can be provided that the organic current distribution layer is formed as an electric charge-carrier transporting layer wherein said charge-carrier is in the form of electrons in the direction of the extension of the layer, when the top electrode is a cathode.

A further embodiment of the invention can provide that the organic current distribution layer is formed as a doped organic layer with one electric-conductivity-enhancing doping. During the formation of one doped organic layer, one or more doping materials are stored in an organic matrix material, whereby it is a matter of an organic semi-conductive material. A layer is called a p-doped organic layer if the organic matrix material contains dopants in the form of acceptors. A doped layer is called an n-doped organic layer if the stored dopants form donators for the organic matrix material. An electric doping in the sense of the present application arises when one or more stored doping materials execute a Redox reaction with the matrix material, whereby an at least part-charge-transfer between the one or more doping materials or the matrix material results, that is, a transfer of electric charge between the materials takes place. In this manner, (additional) free charge-carriers are formed within the layer, which charge-carriers in turn enhance the electric conductivity of the layer. There arises in the matrix material a higher concentration of charge-carriers in comparison to the undoped material. There is the following physical relationship for the electric conductivity: charge-carrier density×mobility of the charge-carrier=electric conductivity. The part of the charge-carrier—said part having been formed by means of the Redox reaction—within the matrix material does not have to be initially injected out of an electrode; moreover, such charge-carriers are already available within the layer as a result of the electric doping.

A preferred improvement of the invention provides that the organic current distribution layer is formed as a fullerene layer.

In a functional embodiment of the invention, it can be provided that the organic current distribution layer is formed in connection with a p-n-junction. The p-n-junction can be formed within the electric current distribution layer. Alternatively the electric current distribution layer borders the p-n-junction or forms a part hereof. In the case that the top electrode is formed as an anode, which in turn is in electric contact with an organic layer, which layer efficiently transports electric charge-carriers in the form of electrons in the direction of the extension of the layer, an efficient provision of electric charge-carriers for the light-emitting region in form of holes is obtained with the p-n-junction. In the region of the p-n-junction, the efficiently transported electric charge-carriers in the form of electrons are converted into electric charge-carriers in the form of holes. Analogously, electric charge-carriers in the form of electrons are provided at a p-n-junction within the organic current distribution layer, when the top electrode is a cathode and this is in electrical contact with a transporting layer wherein holes are in the direction of the extension of the layer.

An advantageous embodiment of the invention provides that the organic current distribution layer is formed partly on one of the sides of the top electrode facing away from the arrangement of organic layers. In this embodiment, the organic current distribution layer is deposited during manufacture of the component, for example, after the deposition of the material for the top electrode. The material for the organic current distribution layer can, in this case, be party deposited directly onto the material of the top electrode.

Preferably a minimal lateral dimension of the top electrode, that is, a smallest size of the flat extension of the section of the top electrode, amounts to at least about 1 µm, preferably at least about 10 µm. In this case, the top electrode can easily be manufactured within an evaporation step within a vacuum with the help of shadow masks. In the case where the top electrode is formed as a grille, a characteristic lateral dimension of the top electrode can be the width of a bar of the grille, for example.

In a functional embodiment, it can be provided that a relative proportion of a total area of the passages—which total area is the sum of the areas of the individual passages—to the total area of the top electrode amounts to at least about 50%, preferably at least about 80%, and even more preferably at least about 90%. In this way, it is ensured that the area of the openings/passages is sufficiently large to ensure an effective extraction of light.

In another particularly simple form, the organic current distribution layer is formed from a layer of charge-carrier transport material and a layer of dopant material bordering hereon. Through a chemical reaction at the interface of the two layers, there results a highly conductive barrier or boundary surface. One can imagine this barrier or boundary surface as a doped interface. Examples for layer combinations of charge-carrier transport material and dopant material are: fullerene C60 and WPW, fullerene C60 and Alkali metals with cesium or potassium, Zinc Phthalocyanine and F4TCNQ, PTCTA and iodine, BEDT-TTF and iodine, TTF and TCNQ.

The organic current distribution layer is formed in a practical way by means of material separation in a vacuum, for example, by means of deposition in a high vacuum. In one embodiment, fullerenes are evaporated. In the case of a doped layer, the fullerenes and the organic dopant are evaporated simultaneously. As a result of this, the deposition fits into the production process of an organic component without additional costs. Possible incompatibilities due to other separation processes such as atomization (sputtering, effects of the reactive ions) or deposition from solutions or pastes (effects of the solvent) are thus avoided.

A further development of transparent organic LEDs are stacked transparent LEDs (see, for example, Gu et al. J. Appl. Phys. 1999, 86, 4067). Hereby a number of transparent LEDs are sequentially stacked onto a substrate, whereby every two consecutive LEDs share a transparent electrode. In order to individually control the LEDs of the stack, transparent electrodes are laterally led out and contacted. For that, a high lateral conductivity of the electrodes is necessary, which is why ITO is usually used. This leads to the same aforementioned problems as with the transparent LEDs. It shall be understood that the inventive structure is likewise advantageous in such configurations.

The combination of the top electrode with passages and the organic current distribution layer can be implemented in any arbitrary optoelectronic component. For example, the insert is advantageous for an organic solar cell, the translucent electrode of which is formed as a top electrode. The organic current distribution layer equipped with higher electric conductivity in direction of the expansion of the layer is then positioned on the top-electrode-facing side of the active layer of the solar cell, which layer transfers light in charge-carriers.

DESCRIPTION OF EXAMPLES OF PREFERRED EMBODIMENTS OF THE INVENTION

Figure 2:
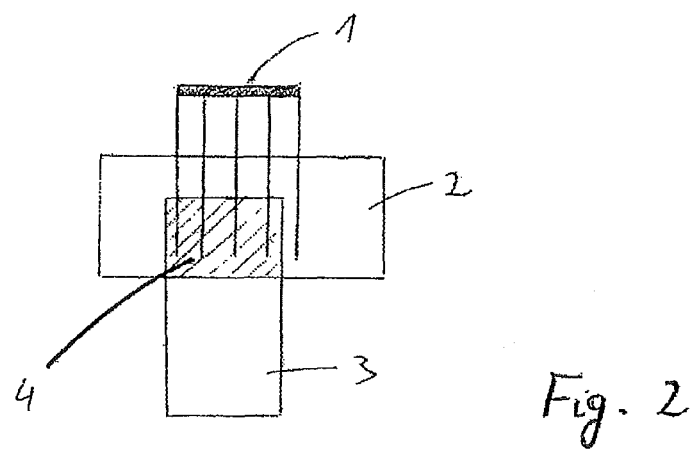
Figure 3:
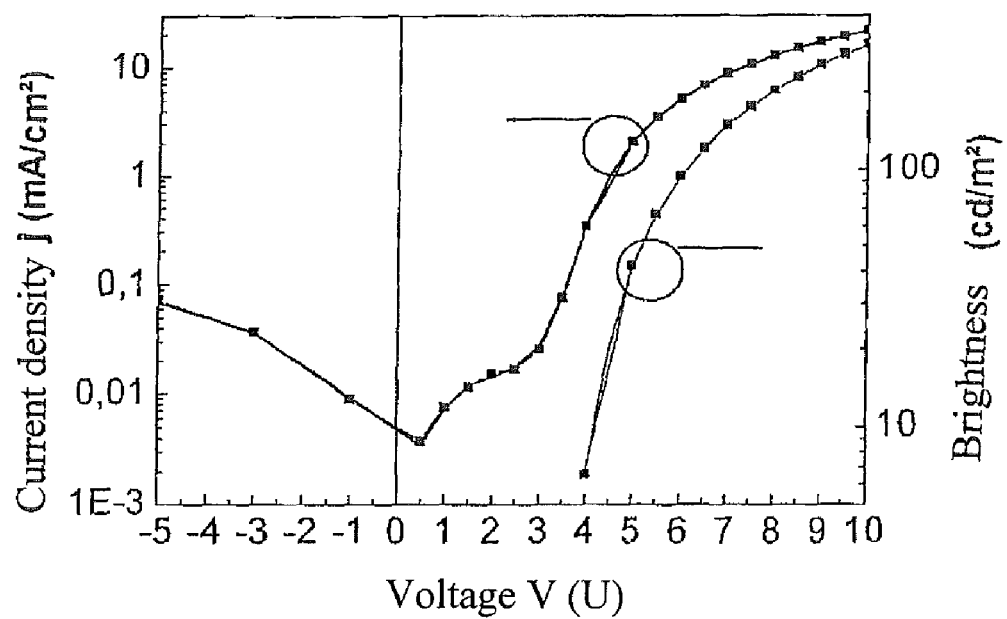
Figure 4:
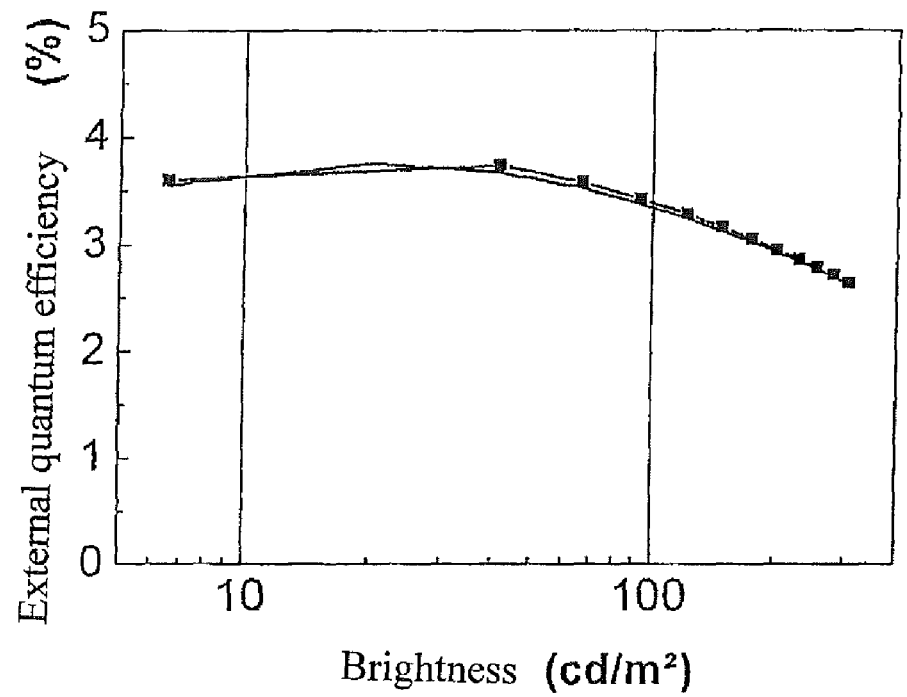
Figure 5:
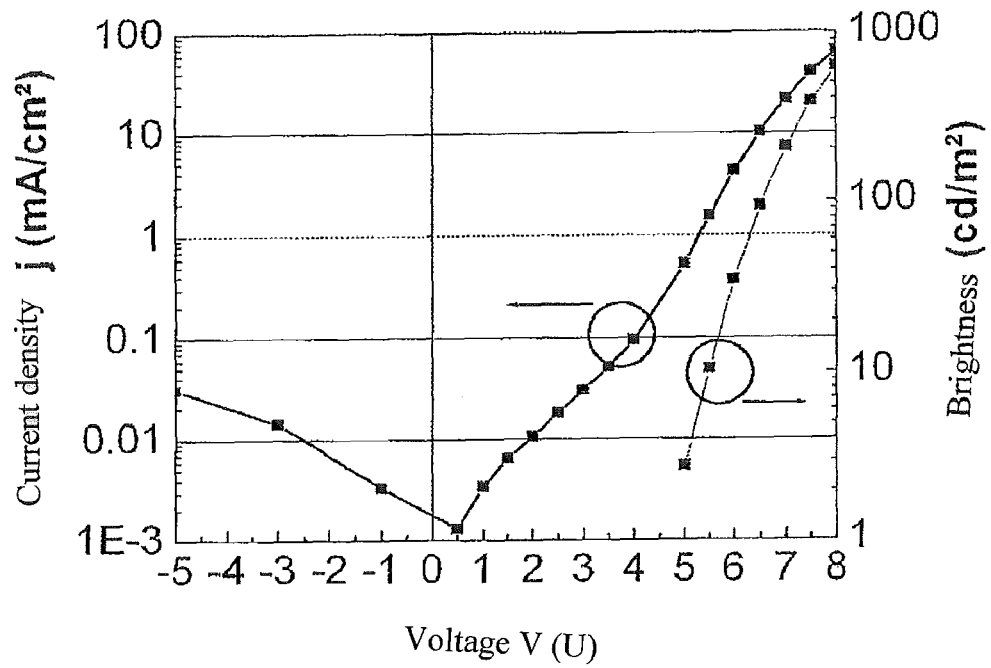
Figure 6:
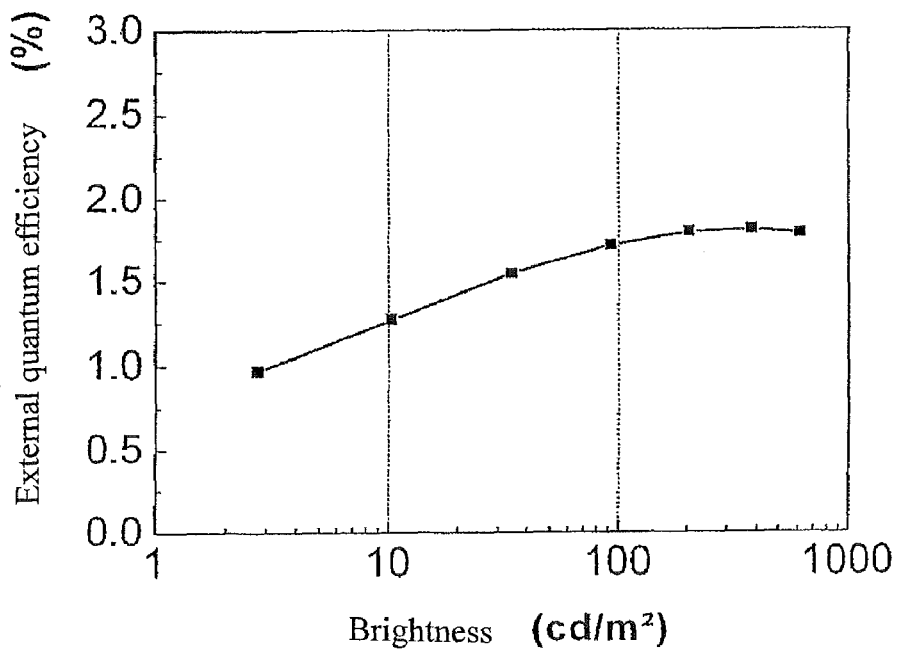
Figure 7:
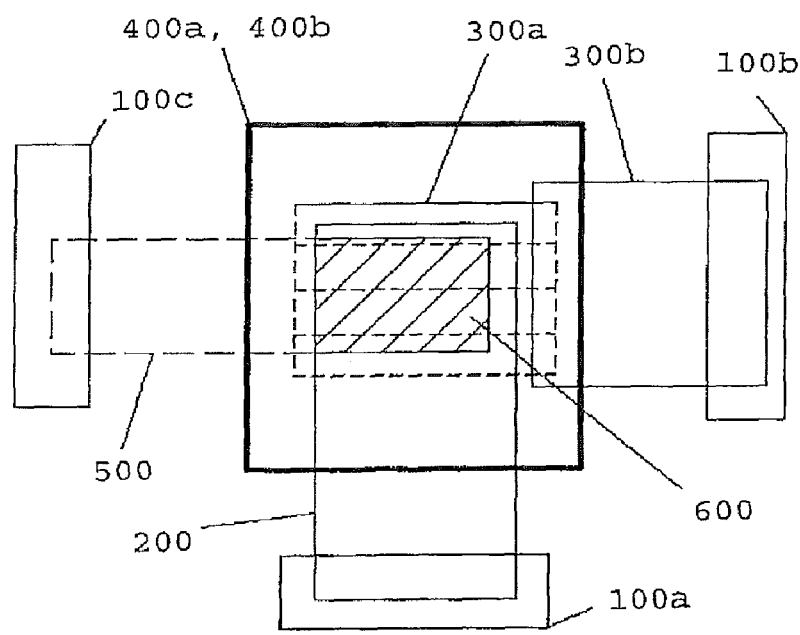

In the following, the invention will be explained in more detail based on the preferred embodiment examples with reference to the figures of a drawing wherein:

FIG. 1 shows a schematic representation of a layer structure of an organic optoelectronic component, FIG. 2 shows a schematic representation of an organic optoelectronic component from above, FIG. 3 shows a graphic representation of current density and brightness in relation to voltage for an organic optoelectronic component according to one embodiment example 1, FIG. 4 shows a graphic representation of external quantum efficiency (EQE) in relation to brightness for the organic optoelectronic component according to the embodiment example 1, FIG. 5 shows a graphic representation of current density and brightness in relation to voltage for an organic optoelectronic component according to one embodiment example 2, FIG. 6 shows a graphic representation of external quantum efficiency (EQE) in relation to brightness for the organic optoelectronic component according to the embodiment example 2, and FIG. 7 shows a schematic representation of an arrangement of stacked organic LEDs.

FIG. 1 shows a schematic representation of an organic optoelectronic component with an organic current distribution layer 20a in an arrangement of organic layers 20, which is arranged between a base electrode 10 and a top electrode 30 provided with a passage 40.

The organic current distribution layer 20a is equipped with an electric conductivity for electric charge-carriers in the form of holes or electrons, so that these charge-carriers can disperse in the direction of the expansion of the layer towards a light-emitting region 20b and also into the region of the passage 40, which is shown in FIG. 1 by an arrow-path (a). Underneath the light-emitting region 20b, a charge-carriers transport layer 20c is formed, with which electric charge-carriers are led to the light-emitting region 20b, which charge-carriers are opposite in polarity to the electric charge-carriers that are led to the light-emitting region 20b from above.

With the help of the organic current distribution layer 20a, the electric resistance of a predominantly vertical-running current-path (b) in FIG. 1 is only negligibly weaker than the electric resistance of the current-path which is designated by (a) in FIG. 1. The generation of light, therefore, takes place, for the most part, underneath the passage 40 formed within the top electrode 30.

In the following, the invention will be explained in more detail based on the further embodiment examples. In so doing, the nm-data describe the layer thicknesses formed in the respective embodiment examples for the materials deposited by means of vapor deposition within a vacuum, which materials are thermally sublimable.

In an embodiment example 1 an organic optoelectronic component includes the following layer structure, which is manufactured by means of vapor deposition within a high vacuum:
1. glass substrate
2. silver electrode 50 nm
3. 95 nm MeO-TPD doped with 4 mol % $F_4$-TCNQ
4. 10 nm Spiro-TAD
5. 20 nm BAlq doped with 20 weight-% $Ir(piq)_3$
6. 10 nm BPhen
7. 65 nm fullerene layer doped with WPW (10 w %)
8. aluminum cathode, accomplished with spaced bar or band elements, between which, passages are formed (spaces between the band elements 450 µm, width of the band elements 50 µm, thickness of the band elements 100 nm)

By way of illustration, FIG. 2 shows a top view of this arrangement. The arrangement emits light through the top electrode by applied potential (positive pole on the silver electrode 3, negative pole on the aluminum cathode 1). The shining surface 4, which is shaded, is determined by the lateral overlapping between the silver anode 1 and a doped fullerene layer 2. If the conductivity of the doped fullerene layer 2 is larger than 0.5 S/cm, the brightness of the shining surface 4 appears homogeneous to the naked eye. The mobility for electrons in a layer of fullerene C60 amounts to more than 0.1 $cm^2/V \cdot s$.

In one embodiment of the example, a lower conductivity of smaller than 0.5 S/cm was achieved, through application of another n-doped layer, namely $C_{60}$ doped with 2 mol % [Ru(t-butyl-trpy)$_2$]$^0$). In this configuration, a simple drop of brightness between bars of the aluminum cathode 1 is visible to the naked eye.

FIGS. 3 and 4 show characteristic curves of the component according to embodiment example 1.

As a comparative example, an organic optoelectronic component with the following structure was manufactured:
1. glass substrate
2. silver electrode 50 nm or ITO 90 nm
3. 95 nm MeO-TPD doped with 4 mol % $F_4$-TCNQ
4. 10 nm Spiro-TAD
5. 20 nm BAlq doped with 20 weight-% Ir(piq)$_3$
6. 10 nm BPhen
7. 65 nm Alq
8. 1 nm LiF
9. aluminum cathode, accomplished as bars or bands (spaces 450 µm, widths 50 µm, thickness 100 nm)

In this comparative example the current distribution layer has been replaced by a traditional non-conductive electron transport layer of Alq. A thin layer of LiF is formed for improved charge-carrier injection. In the case where the anode is formed of silver, some light emission shows up at the edges of the bands of the aluminum cathode 1. The difference from the embodiment example 1 is obvious. In the case where a transparent base electrode of ITO is used, it is apparent that almost all light emissions occur from the surface that is formed by the overlapping of the base and top electrodes.

In an embodiment example 2, an organic optoelectronic component, namely a transparent organic LED, includes the following layer structure:
1. glass substrate
2. 90 nm ITO
3. 95 nm MeO-TPD doped with 4 mol % $F_4$-TCNQ
4. 10 nm Spiro-TAD
5. 20 nm BAlq doped with 20 weight-% Ir(piq)$_3$
6. 10 nm BPhen
7. 65 nm n-doped fullerene layer
8. aluminum cathode, accomplished as bars or bands (spaces 450 µm, widths 50 µm, thickness 100 nm)

In this arrangement, BPhen is used as a holes- and excitons-blocking layer. With approximately 3 eV, BPhen has an electron affinity approximately 0.9 eV lower than does C60, which should be noticeable in a correspondingly high barrier for electrons. Nevertheless this component shows surprisingly very good parameters, as some characteristics show in FIGS. 5 and 6.

In an embodiment example 3, an organic optoelectronic component includes the following layer structure:
1. glass substrate
2. 90 nm ITO
3. 95 nm MeO-TPD doped with 4 mol % $F_4$-TCNQ
4. 10 nm Spiro-TAD
5. 20 nm BAlq doped with 20 weight-% Ir(piq)$_3$
6. 10 nm BPhen
6a. 40 nm BPhen doped with cesium
7. 25 nm PTCDA doped with sodium
8. aluminum cathode, accomplished as bars or bands (spaces 450 µm, widths 50 µm, thickness 100 nm)

In embodiment example 3, it is shown that the PTCDA doped with sodium also exhibits sufficiently high electric conductivity to possess a nearly homogeneous distribution of light emission for the selected electrode geometry. The electric conductivity amounts to about 0.1 S/cm. In order to improve the junction of charge-carriers from the layer of PTCDA:Na into the adjoining BPhen layer, the latter was also doped. The conductivity of the layer of BPhen:Cs is, however, with 0.0001 S/cm, not enough to ensure a lateral distribution of the current alone. This is shown by the fact that light is generated only in the overlapping surface of the base and top electrodes, when the doped PTCDA layer is left out.

In an embodiment example 4, an organic optoelectronic component includes the following layer structure:
1. glass substrate
2. 50 nm silver cathode
3. 40 nm BPhen doped with Cs
4. 10 nm BPhen
5. 20 nm BAlq doped with 20 weight-% Ir(piq)$_3$
6. 50 nm Spiro-TAD
7. 25 nm Perylene doped with iodine
8. silver anode, accomplished as bars or bands (spaces 450 µm, widths 50 µm, thickness 100 nm)

The doped Perylene layer exhibits an electric conductivity of more than 5 S/cm. The mobility for holes within a Perylene layer is greater than $10^{-1}$ cm$^2$/V·s. The light emission occurs laterally and homogeneously. The top electrode is implemented as an anode.

In an embodiment example 5, an organic optoelectronic component, namely a stacked organic LED with a fullerene layer as transparent in-between electrode, includes the following layer structure:
1. transparent substrate
2. ITO
3. first organic LED
4. metal bands
5. doped fullerene layer
6. second organic LED
7. aluminum cathode The stacking can naturally be extended to include more LEDs, whereby the metal bands function together with the doped fullerene layer, each as a transparent in-between electrode. The individual LEDs, which can each emit light of different colors, can be addressed separately, if one also lays or applies the in-between electrodes on top of appropriate potentials. This was already demonstrated in the document U.S. Pat. No. 5,917,280, where, a control scheme is also proposed hereunto. This separate addressing is advantageous for display applications because of the higher pixel density attainable with the stacking as well as for illumination purposes because of the adjustability of the colors of the light source.

In the embodiment example 5, a special challenge is the leading out of the metal bands out of the stack and their stable contacting, without thereby causing a short circuit to the other electrodes. For this purpose, an arrangement is shown in FIG. 7, which avoids this problem by leading out the in-between electrodes to different sides of the stack. In this way short circuits between the individual electrodes are avoided. Here, the following reference numbers will be used: 100a, 100b, 100c—contacts; 200—transparent anode, for example, made of ITO; 300a—transparent in-between electrode, comprising metal bands and a doped fullerene layer; 300b—thick metal layer for the contacting of the transparent in-between electrode 300a with the contact 100b; 400a—first organic LED; 400b—second organic LED; 500—cathode, for example, made of aluminum; and 600 (shaded)—overlapping region of the electrodes, shining surface.

The height of the step, which must be overcome by the led-out electrodes since the actual contact is usually deposited directly onto the substrate, increases as the number of stacked organic LEDs does. Since the metal bands, however, may only be some 10-nm thick, there is the increasingly high danger that the bands will no longer be continuous when they go over the step. In the present arrangement, this is remedied in such a way that the metal bands indeed go out of the overlapping region of the electrodes, but not beyond the underlying organic layer. A thick metal layer is then deposited thereon, which layer overcomes the step and leads to the actual contact.

The extension onto more than two organic LEDs stacked on one another is possible because each of the accessory in-between electrodes are led to the respective other side of the stack and contacted, according to the previous explanation. Especially when more than four electrodes and in-between electrodes should be contacted, it can be advantageous to deposit the organic layers in polygonal form instead of in rectangular form, in order to enable, for every electrode which is to be contacted, a shortest possible edge line of the step which is to be overcome.

Hereinafter the organic materials which were used in the previously described embodiment examples will be shown:

MeO-TPD
N,N,N',N'-Tetrakis(4-methoxyphenyl)-benzide

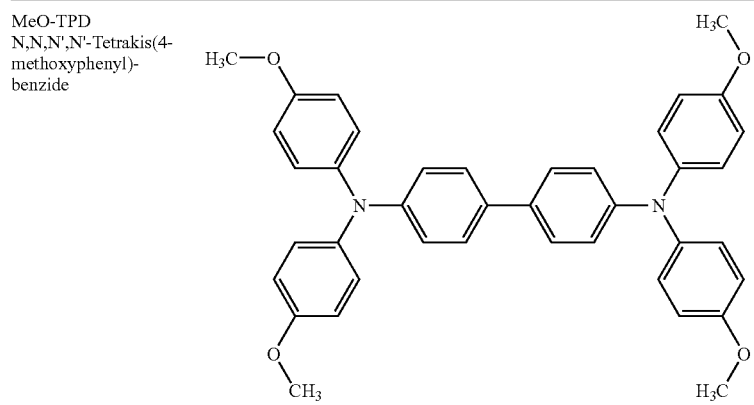

Spiro-TAD
2,2',7,7'-Tetrakis-(N,N-diphenylamino)-9,9-spirobifluoren

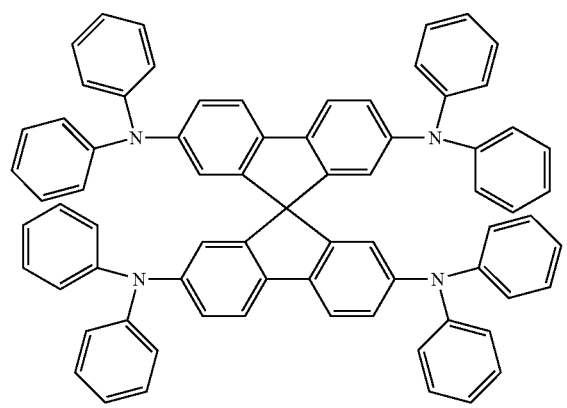

Balq
Bis-(2-methyl-8-quinlinolato)-4-(phenyl-phenolato)-aluminum-(III)

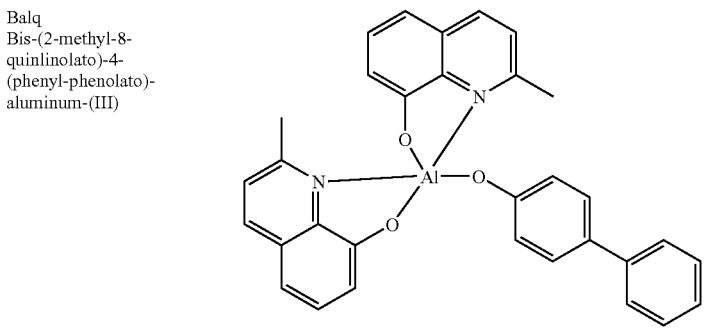

-continued

Ir(piq)₃
Tris(1-phenylisoquinoline) iridium

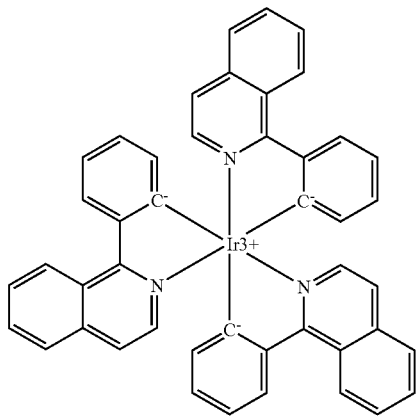

Bphen
4,7-diphenyl-1,10-phenanthroline

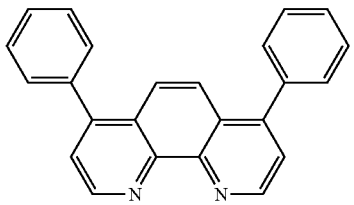

[Ru(t-butyl-trpy)₂]⁰

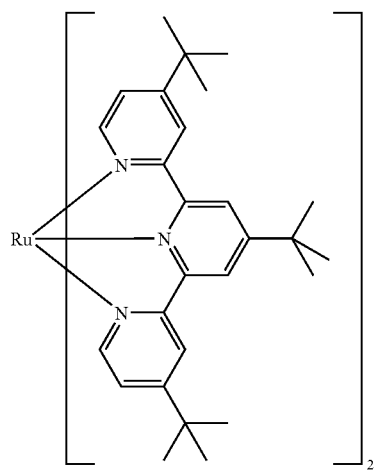

AOB
Acridine orange base

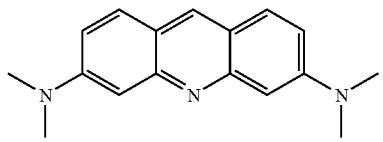

| | |
|---|---|
| WPW | Tetrakis(1,2,3,3a,4,5,6,6a,7,8-decahydro-1,9,9b-triazaphenalenyl) triazaphenalenyl)ditungsten(II); |
| PTCDA | Perylene tetracarbonsäure dianhydrid |
| BEDT-TTF | Bisethylenedithiatetrathiafulvalene |
| TCNQ | Tetrazyano Chinodimethane |

The inventive features disclosed in the above-mentioned description, the claims, and the drawings, can, individually as well as in any combination, relate to the development of the invention in different embodiments.

What is claimed is:

1. An organic optoelectronic component, comprising a base electrode, a top electrode, and an arrangement of organic layers, wherein the arrangement of organic layers comprises an organic current distribution layers, wherein the top electrode comprises passages, wherein the arrangement of organic layers is arranged between the base electrode and the top electrode, and wherein the arrangement of organic layers is in electrical contact with the base electrode and the top electrode; wherein component light can be generated in a light-emitting region by the application of electrical energy to the base electrode and the top electrode; wherein at least part of the organic current distribution layer extends into a region containing at least a portion of the passages of the top electrode, wherein the organic current distribution layer is in electrical contact with the top electrode and the light-emitting region, and wherein the organic current distribution layer has an electric conductivity of at least 0.001 S/cm.

2. The component according to claim 1, wherein the organic current distribution layer is in physical contact with the top electrode.

3. The component according to claim 1, wherein a minimal dimension of the passages is at least as large as a total height of the arrangement of organic layers.

4. The component according to claim 1, wherein the organic current distribution layer comprises an electric charge-carrier layer for holes in the direction of the extension of the organic current distribution layer, when the top electrode is an anode.

5. The component according to claim 1, wherein the organic current distribution layer comprises an electric charge-carrier layer for electrons in the direction of the extension of the organic current distribution layer, when the top electrode is a cathode.

6. The component according to claim 1, wherein the organic current distribution layer comprises a doped organic layer, wherein the dopant enhances electric conductivity.

7. The component according to claim 1, wherein the organic current distribution layer comprises a fullerene layer.

8. The component according to claim 1, wherein the organic current distribution layer is in connection with a p-n-junction.

9. The component according to claim 1, wherein the organic current distribution layer is arranged at least partly on one side of the top electrode that faces away from the arrangement of organic layers.

10. A device comprising an organic optoelectronic component, wherein the optoelectronic component comprises a base electrode, a top electrode, and an arrangement of organic layers, wherein the arrangement of organic layers comprises an organic current distribution layer, wherein the top electrode comprises passages, wherein the arrangement of organic layers is arranged between the base electrode and the top electrode, and wherein the arrangement of organic layers is in electrical contact with the base electrode and the top electrode; wherein component light can be generated in a light-emitting region by the application of electrical energy to the base electrode and the top electrode; wherein at least part of the organic current distribution layer extends into a region containing at least a portion of the passages of the top electrode, wherein the organic current distribution layer is in electrical contact with the top electrode and the light-emitting region, wherein the organic current distribution layer has an electric conductivity of at least 0.001 S/cm; and wherein the device is selected from the following group of devices: a component, a display device, or a display and illumination device.

11. The device of claim 10, wherein the component comprises an organic LED or organic solar cell, and the display device comprises a monitor.

12. The component according to claim 1, wherein the organic current distribution layer has an electric conductivity of 0.05 S/cm.

13. The component according to claim 1, wherein the organic distribution layer has an electric conductivity of at least 1 S/cm.

14. An organic optoelectronic component, comprising a base electrode, a top electrode, and an arrangement of organic layers, wherein the arrangement of organic layers comprises an organic current distribution layer, wherein the top electrode comprises passages, wherein the arrangement of organic layers is arranged between the base electrode and the top electrode, and wherein the arrangement of organic layers is in electrical contact with the base electrode and the top electrode; wherein component light can be generated in a light-emitting region by the application of electrical energy to the base electrode and the top electrode; wherein at least part of the organic current distribution layer extends into a region containing at least a portion of the passages-of the top electrode, wherein the organic current distribution layer is in electrical contact with the top electrode and the light-emitting region, and wherein the organic current distribution layer is formed in connection with a p-n junction.

15. The component according to claim 14, wherein the organic current distribution layer is in physical contact with the top electrode.

16. The component according to claim 14, wherein the organic current distribution layer has an electric conductivity of at least 0.001 S/cm.

17. The component according to claim 14, wherein the organic current distribution layer has an electric conductivity of 0.05 S/cm.

18. The component according to claim 14, wherein the organic current distribution layer has an electric conductivity of at least 1 S/cm.

19. The component according to claim 14, wherein a minimal dimension of the passages is at least as large as a total height of the arrangement of organic layers.

20. The component according to claim 14, wherein the organic current distribution layer comprises an electric charge-carrier layer for holes in the direction of the extension of the organic current distribution layer, when the top electrode is an anode.

21. The component according to claim 14, wherein the organic current distribution layer comprises an electric charge-carrier layer for electrons in the direction of the extension of the organic current distribution layer, when the top electrode is a cathode.

22. The component according to claim 14, wherein the organic current distribution layer comprises a doped organic layer, wherein the dopant enhances electric conductivity.

23. The component according to claim 14, wherein the organic current distribution layer comprises a fullerene layer.

24. The component according to claim 14, wherein the organic current distribution layer is arranged at least partly on one side of the top electrode that faces away from the arrangement of organic layers.

25. A device comprising an organic optoectronic component, wherein the optoelectronic component comprises a base electrode, a top electrode, and an arrangement of organic layers, wherein the arrangement of organic layers comprises an organic current distribution layer, wherein the top electrode comprises passages, wherein the arrangement of organic layers is arranged between the base electrode and the top electrode, and wherein the arrangement of organic layers is in electrical contact with the base electrode and the top electrode; wherein component light can be generated in a light-emitting region by the application of electrical energy to the base electrode and the top electrode; wherein at least part of the organic current distribution layer extends into a region containing at least a portion of the passages of the top electrode, wherein the organic current distribution layer is in electrical contact with the top electrode and the light-emitting region, wherein the organic current distribution layer is formed in connection with a p-n-junction; and wherein the device is selected from the following group of devices: a component, a display device, or a display and illumination device.

26. The device of claim 25, wherein the component comprises an organic LED or organic solar cell, and the display device comprises a monitor.

27. An organic optoelectronic component, comprising a base electrode, a top electrode, and an arrangement of organic layers, wherein the arrangement of organic layers comprises an organic current distribution layer, wherein the top electrode comprises passages, wherein the arrangement of organic layers is arranged between the base electrode and the top electrode, and wherein the arrangement of organic layers is in electrical contact with the base electrode and the top electrode; wherein component light can be generated in a light-emitting region by the application of electrical energy to the base electrode and the top electrode; wherein at least part of the organic current distribution layer extends into a region containing at least a portion of the passages of the top electrode, wherein the organic current distribution layer is in electrical contact with the top electrode and the light-emitting region, and wherein the organic current distribution layer is arranged at least partly on one side of the top electrode that faces away from the arrangement of organic layers.

28. The component according to claim 27, wherein the organic current distribution layer is in physical contact with the top electrode.

29. The component according to claim 27, wherein the organic current distribution layer has an electric conductivity of at least 0.001 S/cm.

30. The component according to claim 27, wherein the organic current distribution layer has an electric conductivity of 0.05 S/cm.

31. The component according to claim 27, wherein the organic current distribution layer has an electric conductivity of at least 1 S/cm.

32. The component according to claim 27, wherein a minimal dimension of the passages is at least as large as a total height of the arrangement of organic layers.

33. The component according to claim 27, wherein the organic current distribution layer comprises an electric charge-carrier layer for holes in the direction of the extension of the organic current distribution layer, when the top electrode is an anode.

34. The component according to claim 27, wherein the organic current distribution layer comprises an electric charge-carrier layer for electrons in the direction of the extension of the organic current distribution layer, when the top electrode is a cathode.

35. The component according to claim 27, wherein the organic current distribution layer comprises a fullerene layer.

36. A device comprising an organic optoelectronic component, wherein the optoelectronic component comprises a base electrode, a top electrode, and an arrangement of organic layers, wherein the arrangement of organic layers comprises an organic current distribution layer, wherein the top electrode comprises passages, wherein the arrangement of organic layers is arranged between the base electrode and the top electrode, and wherein the arrangement of organic layers is in electrical contact with the base electrode and the top electrode; wherein component light can be generated in a light-emitting region by the application of electrical energy to the base electrode and the top electrode; wherein at least part of the organic current distribution layer extends into a region containing at least a portion of the passages of the top electrode, wherein the organic current distribution layer is in electrical contact with the top electrode and the light-emitting region, and wherein the organic current distribution layer is arranged at least partly on one side of the top electrode that faces away from the arrangement of organic layers; and wherein the device is selected from the following group of devices: a component, a display device, or a display and illumination device.

37. The device of claim 36, wherein the component comprises an organic LED or organic solar cell, and the display device comprises a monitor.

* * * * *